US007141338B2

(12) United States Patent
Chen et al.

(10) Patent No.: US 7,141,338 B2
(45) Date of Patent: Nov. 28, 2006

(54) SUB-RESOLUTION SIZED ASSIST FEATURES

(75) Inventors: Xiaochun Linda Chen, Mechanicsville, VA (US); Lawrence Varnerin, Mechanicsville, VA (US); Bernhard Liegl, Cold Spring, NY (US)

(73) Assignee: Infineon Technologies AG, Munich (DE)

( * ) Notice: Subject to any disclaimer, the term of this patent is extended or adjusted under 35 U.S.C. 154(b) by 370 days.

(21) Appl. No.: 10/292,169

(22) Filed: Nov. 12, 2002

(65) Prior Publication Data

US 2004/0091790 A1    May 13, 2004

(51) Int. Cl.
*G01F 9/00* (2006.01)
(52) U.S. Cl. .......................................................... 430/5
(58) Field of Classification Search .................... 430/5, 430/30
See application file for complete search history.

(56) References Cited

U.S. PATENT DOCUMENTS

| | | | |
|---|---|---|---|
| 5,242,770 A | 9/1993 | Chen et al. | |
| 5,707,765 A * | 1/1998 | Chen | 430/5 |
| 5,725,973 A * | 3/1998 | Han et al. | 430/5 |
| 5,821,014 A * | 10/1998 | Chen et al. | 430/5 |
| 5,827,623 A | 10/1998 | Ishida et al. | |
| 6,238,850 B1 | 5/2001 | Bula et al. | |
| 6,327,023 B1 | 12/2001 | Bukofsky et al. | |
| 6,451,490 B1 | 9/2002 | Advocate et al. | |
| 6,770,403 B1 * | 8/2004 | Park et al. | 430/5 |

* cited by examiner

*Primary Examiner*—S. Rosasco
(74) *Attorney, Agent, or Firm*—Slater & Matsil, L.L.P.

(57) ABSTRACT

Corner rounding and image shortening is substantially reduced in an image printed on a substrate by illuminating a photolithographic mask and projecting light transmitted through the photolithographic mask onto the substrate using an optical projection system. The photolithographic mask has a mask pattern that includes at least one printable feature having at least one corner. Incorporated, in the mask pattern, is at least one line feature corresponding to the corner of the printable feature. The line feature is in at least close proximity to the corresponding corner of the printable feature and has a line width that is smaller than a minimum resolution of the optical projection system.

12 Claims, 5 Drawing Sheets

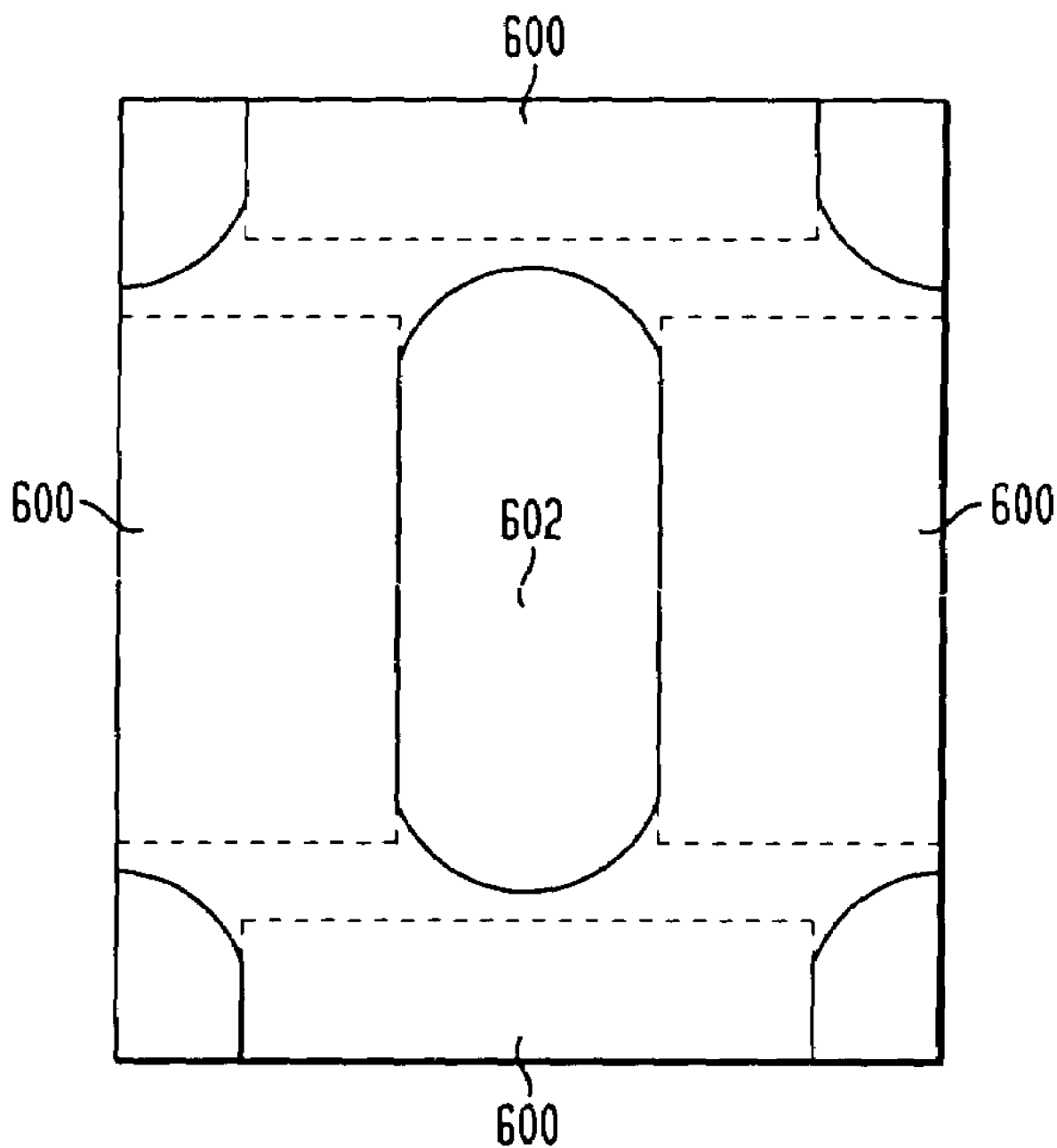

SUB-RESOLUTION SIZED ASSIST FEATURES

BACKGROUND OF THE INVENTION

The present invention relates to photolithographic processes and masks such as are used for the fabrication of semiconductor devices and, more particularly, to photolithographic processes and masks for printing sub-micron sized features on a substrate.

In existing optical photolithographic processes, a photolithographic mask, having various patterns that are to be printed on a substrate, is illuminated by a light source. The light is transmitted through the openings in the mask and collected by a projection lens that images the mask patterns onto a wafer or other substrate located at the image projection plane, typically at a predetermined reduction ratio. The focused image exposes one or more photoresist layers that were previously coated onto the wafer, and the exposed resist is then developed using a developer solution. The developer removes the exposed portions of the resist layer when a positive resist is used and removes the unexposed portions of the resist when a negative resist is used. As a result, the mask pattern is essentially transferred onto the resist and may be used to mask subsequent etching or doping steps.

As newer generations of denser and/or faster devices are introduced, smaller sized features must be printed on the surface of the wafer, extending the limits of optical photolithography. The optical photolithographic systems and the photoresists are required to operate in regions of non-linear behavior, which often degrades the control of critical dimensions of the printed features. Further, as the feature sizes approach or become smaller than the wavelength of the light source used to illuminate the mask, optical distortions are introduced in the printed patterns. The optical distortions cause printed line edge variations that are dependent on the density, size and location of adjacent features. The line edge variations often result in line length contraction, known as line shortening, which can bring about increased contact resistance as well as open circuits. The line edge variations can also cause the corners of printed features to round off, known as corner rounding, which can lead to uncontrolled changes in resistance along critical circuit paths.

A known approach for addressing these problems is to adjust the illumination conditions used when exposing the mask, such as adjusting the spatial coherency, the angle of illumination, the degree of defocusing and the exposure time. However, the optimal illumination conditions for reducing line shortening and corner rounding are often not the best conditions for the resolution of the printed features.

Another existing approach is to adjust the mask bias. The edges of the features on the mask are extended to compensate for the line shortening or corner rounding in the printed pattern on the wafer. However, as the device density grows and the feature sizes further shrink, there is often insufficient room between adjacent features on the mask to extend the edges to sufficiently compensate for these variations.

An additional known approach is to add shapes, known as serifs, to the mask pattern to add or subtract light in the areas where line shortening or corner rounding occurs which compensates for the shortening or rounding. This technique has the drawback, however, that the serifs are very small and make mask inspection and writing very difficult. Moreover, each feature may require multiple serifs, thereby greatly increasing the data that must be stored in the mask writing system when preparing such a mask. Additionally, the use of serifs becomes less effective as feature sizes decrease.

A further known alternative is described in U.S. Pat. No. 6,451,490 B1, titled "Method To Overcome Image Shortening By Use Of Sub-Resolution Reticle Features" to W. H. Advocate, et al., the disclosure of which is incorporated herein by reference. To address the problem of image shortening of dense array patterns, features smaller than the resolution capability of the photolithographic system, known as sub-resolution features, are added to the mask pattern and are oriented perpendicular to at least one feature of the dense array pattern. The sub-resolution features have a smaller width than that of the feature of the array pattern and do not print on the wafer. The sub-resolution features shown, however, are either located in the spaces between the features of the dense array pattern or bisect the features of the dense array pattern and therefore do not significantly reduce corner rounding and are not optimally located for minimizing line shortening.

It is therefore desirable to reduce the line shortening or corner rounding in a printed feature in a manner that avoids the above drawbacks.

SUMMARY OF THE INVENTION

The present invention addresses the problems of line shortening and corner rounding by incorporating sub-resolution features in place of the corners or in close proximity to the corners of the feature.

In accordance with an aspect of the invention, corner rounding and image shortening is substantially reduced in an image that is printed on a substrate by illuminating a photolithographic mask and projecting light transmitted through the photolithographic mask onto the substrate using an optical projection system. The photolithographic mask has a mask pattern that includes at least one printable feature having at least one corner. At least one line feature corresponding to the corner of the printable feature is incorporated in the mask pattern. The line feature is in at least close proximity to the corresponding corner of the printable feature and has a line width that is smaller than a minimum resolution of the optical projection system.

In accordance with another aspect of the invention, a feature is printed on a substrate using an optical projection system. A photolithographic mask is irradiated using a light source. The photolithographic mask has a mask pattern that includes at least one printable feature having at least one corner and that includes at least one line feature corresponding to the corner of the printable feature. The line feature is in at least close proximity to the corresponding corner of the printable feature and has a line width that is smaller than a minimum resolution of the optical projection system. Light transmitted through the photolithographic mask is projected onto the substrate using the optical projection system.

In accordance with a further aspect of the invention, a photolithographic mask is formed for use in an optical projection system. A mask pattern that includes at least one printable feature having at least one corner is provided. Incorporated, in the mask pattern, is at least one line feature corresponding to the corner of the printable feature. The line feature is in at least close proximity to the corresponding corner feature of the printable feature and has a line width that is smaller than a minimum resolution of the optical system.

In accordance with an additional aspect of the invention, a photolithographic mask for use in an optical projection system includes a mask pattern that includes at least one printable feature having at least one corner. At least one line feature, formed in the mask pattern, corresponds to the corner of the printable feature. The line feature is in at least close proximity to the corresponding feature of the printable feature and has a line width that is smaller than a minimum resolution of the optical projection system.

According to a still further aspect of the invention, corner rounding and image shortening is substantially reduced in an image that is printed on a substrate by illuminating a photolithographic mask and projecting light transmitted through the photolithographic mask onto the substrate using an optical projection system. The photolithographic mask has a mask pattern that includes at least one rectangular feature. Incorporated, in the mask pattern, is a plurality of line features each corresponding to a respective corner of the rectangular feature. An end of each of the line features is disposed in place of the corresponding corner of the rectangular feature. Each of the line features has a line width that is smaller than a minimum resolution of the optical projection system.

According to yet another aspect of the invention, a feature is printed on a substrate using an optical projection system. A photolithographic mask is irradiated using a light source. The photolithographic mask has a mask pattern that includes at least one rectangular feature and that includes a plurality of line features that each correspond to a respective corner of the rectangular feature. An end of each of the line features is disposed in place of the corresponding corner of the rectangular feature. Each of the line features has a line width that is smaller than a minimum resolution of the optical projection system. Light transmitted through the photolithographic mask is projected onto the substrate using the optical projection system.

According to yet an additional aspect of the invention, a photolithographic mask is formed for use in an optical projection system. A mask pattern is provided that includes at least one rectangular feature. Incorporated, in the mask pattern, is a plurality of line features each corresponding to a respective corner of the rectangular feature. An end of each of the plurality of line features is disposed in place of the corresponding corner of the rectangular feature. Each of the line features has a line width that is smaller than a minimum resolution of the optical projection system.

In accordance with still another aspect of the invention, a photolithographic mask for use in an optical projection system includes a mask pattern that includes at least one rectangular feature. A plurality of line features, formed in the mask pattern, each correspond to a respective corner of the rectangular feature. An end of each of the plurality of lines features is disposed in place of the corresponding corner of the rectangular feature. Each of the plurality of line features has a line width that is smaller than the minimum resolution of the optical projection system.

The foregoing aspects, features and advantages of the present invention will be further appreciated when considered with reference to the following description of the preferred embodiments and accompanying drawings.

BRIEF DESCRIPTION OF THE DRAWINGS

FIG. 6 is a diagram illustrating a pattern printed on a substrate using the mask pattern of FIG. 5A with reference to the mask pattern.

DETAILED DESCRIPTION

Figure 1A:
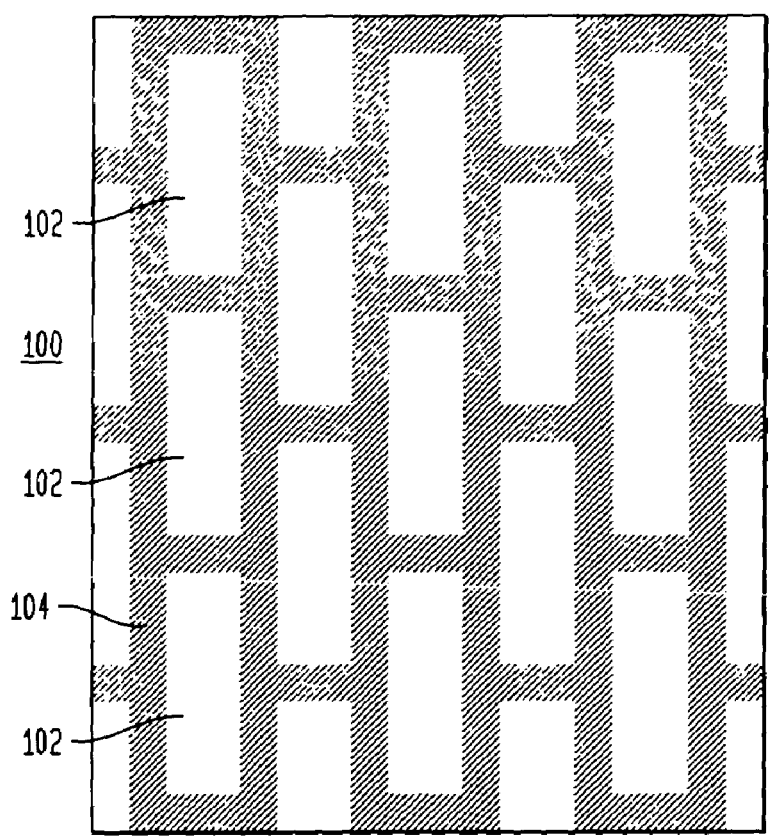
FIG. 1A is a diagram showing a top view of a known photolithographic mask pattern.
Figure 1B:
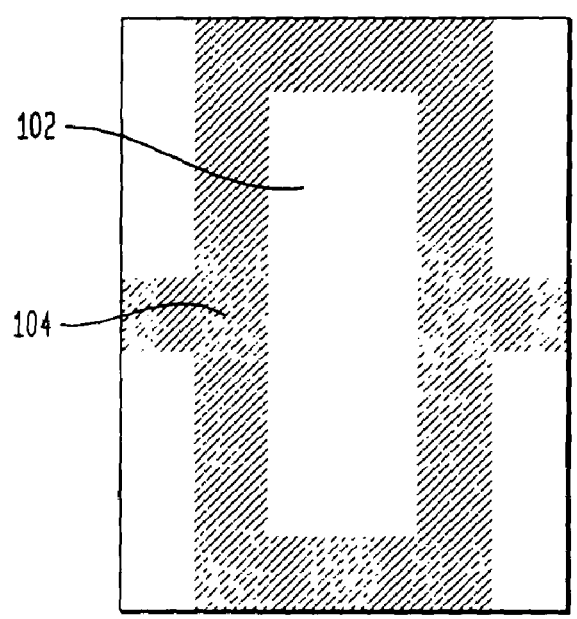
FIG. 1B is a diagram showing a portion of the mask pattern of FIG. 1A in greater detail.

FIG. 1A shows an example of a portion of a photolithographic mask for printing a dense array pattern 100, such as a deep trench (DT) pattern. The mask pattern includes a plurality of clear, rectangular shaped openings 102 formed in an opaque or partially transmissive material such that each of the openings is surrounded by an opaque or partially transmissive border 104. FIG. 1B illustrates, in greater detail, the mask region surrounding one of the openings 102.

When the patterns on the mask have dimensions suitable for printing sub-micron sized features, the features printed on the substrate are often prone to line shortening and corner rounding. To compensate for such optical distortions, the length of the deep trench pattern must be extended. As an example, to print deep trench patterns with a desired length of 240 nm and a desired width of 120 nm, the mask pattern must be extended to a length of 384 nm.

Figure 2:
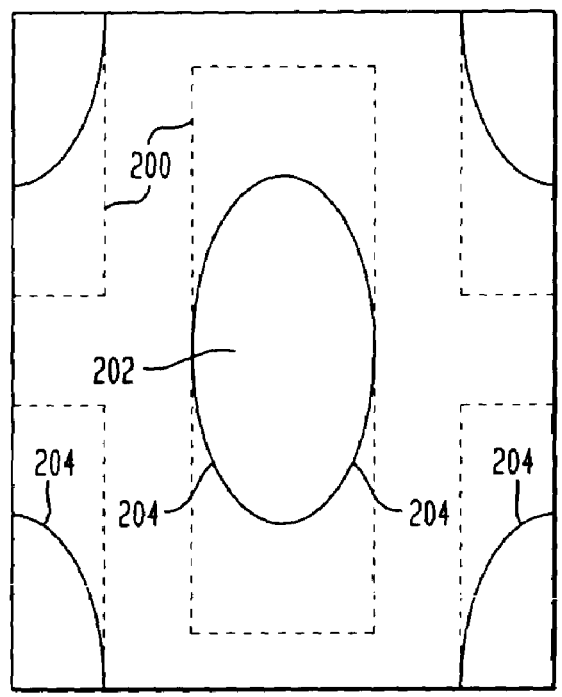
FIG. 2 is a diagram illustrating a pattern printed on a substrate using the mask pattern of FIG. 1A with reference to the mask pattern.

FIG. 2 illustrates an example of features printed using such a compensated mask. For illustrative purposes, a printed feature 202 is shown with the actual mask pattern 200 superimposed thereon.

The printed feature 202 has a length substantially less than the mask pattern used to print the feature. As an example, when a deep trench having a 120 nm width and a 240 nm length is desired and the pattern is printed using a mask having a compensated length of 384 nm, the actual printed feature is 70 nm shorter than the desired length. Further, the corners of the printed feature 202 are rounded, as shown at corners 204. The degree of line shortening and corner rounding are also not readily controllable.

Though additional length and width compensation may be desired to alleviate the line shortening and corner rounding, the deep trench patterns are often too closely spaced together to permit additional widening or lengthening of the mask openings.

Figure 3A:
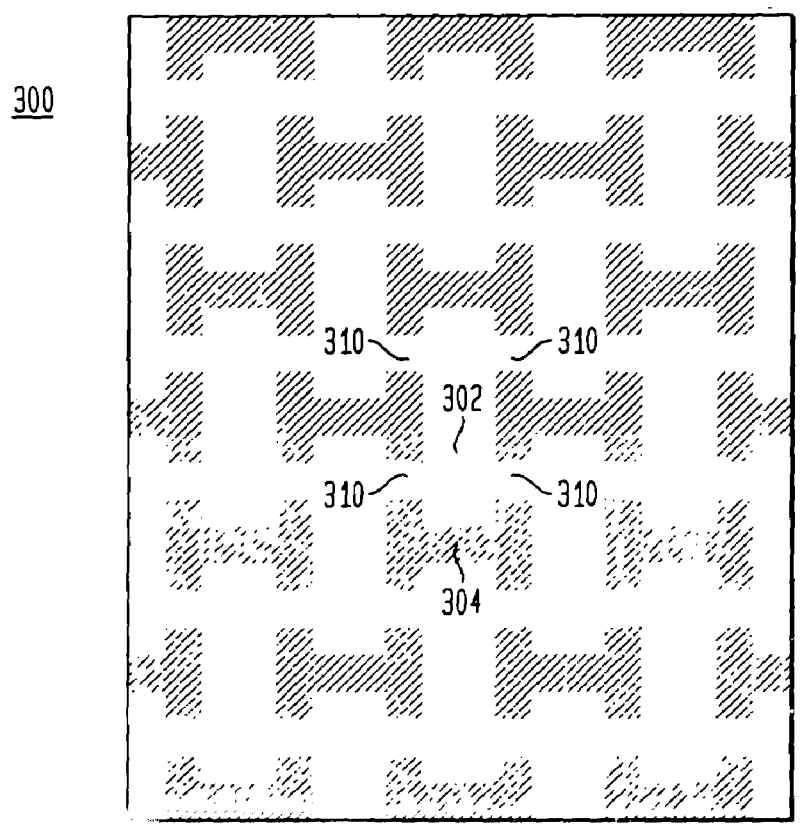
FIG. 3A is a diagram showing a top view of a mask pattern that includes sub-resolution features in accordance with an aspect of the invention.
Figure 3B:
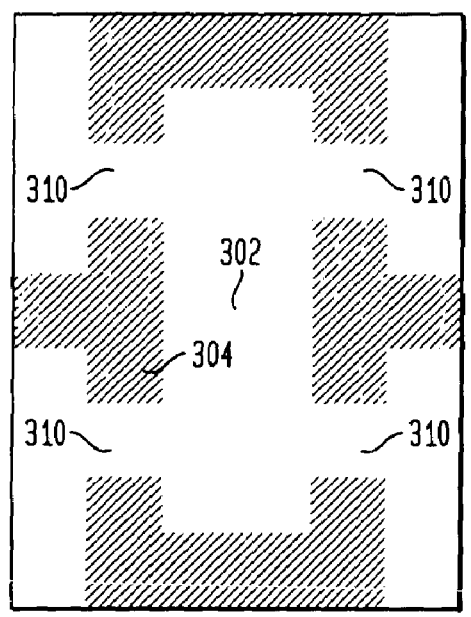
FIG. 3B is a diagram showing a portion of the mask pattern of FIG. 3A in greater detail.

To address these problems, the invention includes sub-resolution sized line features in the mask pattern that are narrower than the resolution limit of the printing system in which the mask is used. FIG. 3A shows an example of a region of a mask pattern that incorporates such sub-resolution sized line features. The mask pattern includes a dense array pattern 300 comprised of openings 302 formed in an opaque material or a partially transmissive material, such as is used in attenuated phase shifted masks or alternating phase shifted masks, so that the openings 302 are surrounded by a border 304, such as for forming deep trench patterns. To compensate for the line shortening and corner rounding effects described above, sub-resolution sized line features 310 are included in proximity to the corners of the openings 302. The sub-resolution sized line features permit light to pass through the mask near the corners, and the light is projected onto the substrate to reduce the line shortening and corner rounding effects. FIG. 3B shows the region surrounding one of the openings shown in FIG. 3A in greater detail.

Figure 4:
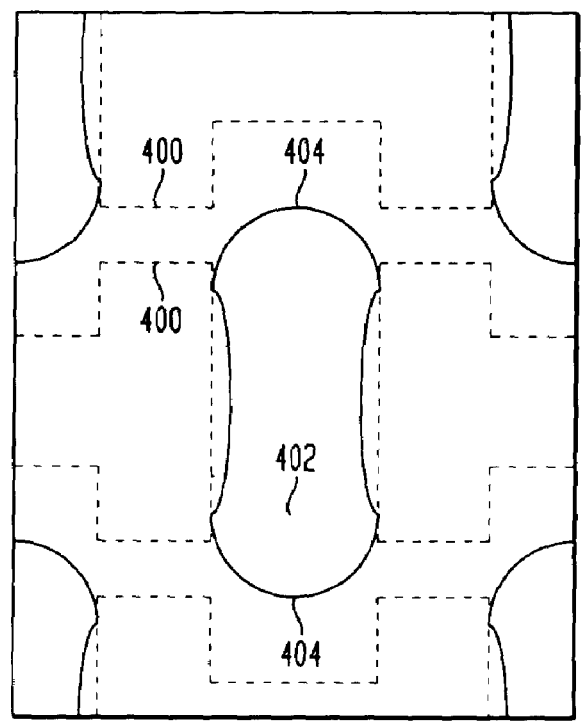
FIG. 4 is a diagram illustrating a pattern printed on a substrate using the mask pattern of FIG. 3A with reference to the mask pattern.

FIG. 4 illustrates an example of a feature 402 printed using an optical projection system on a substrate and shows a portion of a mask pattern 400 superimposed thereon for reference. The printed pattern 402 more closely duplicates the shape of the mask opening 302 shown in FIGS. 3A-3B than does the printed pattern 202 shown in FIG. 2. The line shortening and corner rounding effects are also significantly reduced. As an example, when a mask pattern that is dimensioned to print deep trench features having a length of 240 nm and a width of 120 nm is used, the line shortening of the actual printed feature is 44 nm, whereas the line shortening in the printed feature 202 shown in FIG. 2 is 70 nm.

Figure 5A:
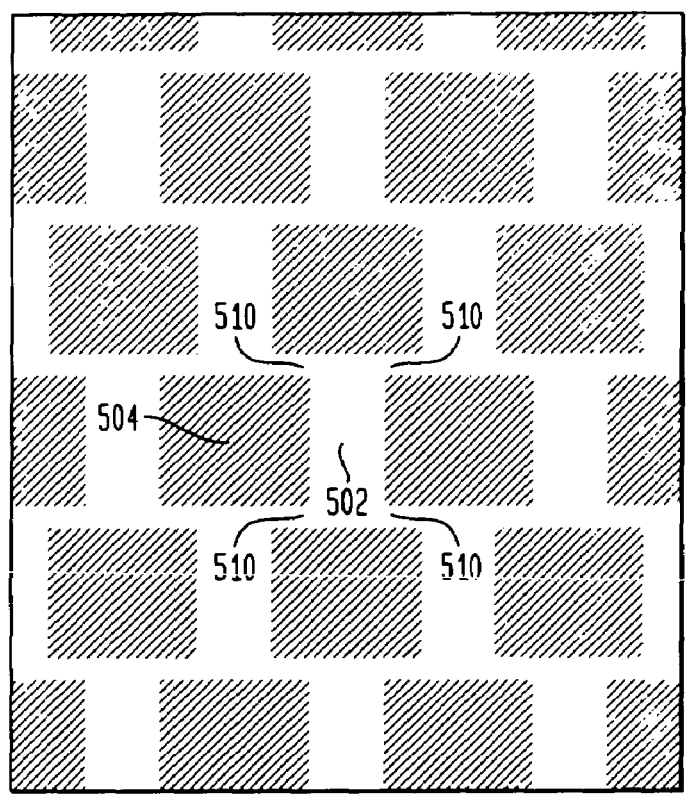
FIG. 5A is a diagram showing a top view of a photolithographic mask pattern that incorporates sub-resolution features in accordance with another aspect of the invention.
Figure 5B:
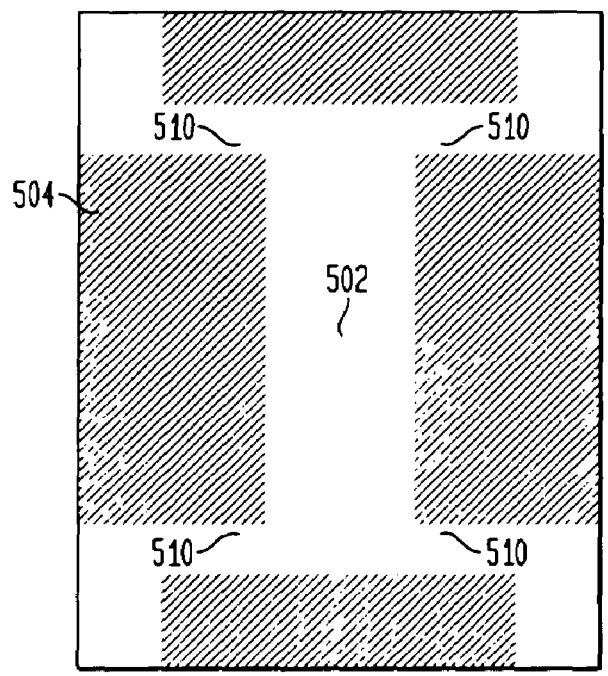
FIG. 5B is a diagram showing a portion of the mask pattern of FIG. 5A in greater detail.

FIGS. 5A and 5B illustrate another embodiment of the invention in which the sub-resolution sized line features are arranged in a mask pattern 500 such that the ends of the line features extend from the corners of the openings in the dense array pattern and thus eliminate the corners.

The mask pattern 500 includes openings 502 and an opaque or partially transmissive border 504, such as for forming deep trench patterns. The sub-resolution sized line features 510 may extend from an opening to an adjacent opening. As an example, when deep trench patterns having a length of 240 nm and a width of 120 nm are desired, 50 nm wide sub-resolution assist features may be incorporated.

FIG. 6 illustrates an example of a feature 602 printed on a substrate by the mask pattern shown in FIGS. 5A and 5B using an optical projection system. A portion of the mask pattern 600 is shown superimposed thereon for reference. The printed feature 602 has substantially less length shortening when compared to the printed patterns shown in FIGS. 2 and 4. As an example, when deep trench patterns having a width of 120 nm and a length of 240 nm are desired, the length shortening is reduced to about 25 nm. As a result, such features may be printed using smaller mask compensations, such as using a mask having openings with a length only of 290 nm. Further, corner rounding is also substantially reduced.

The sub-resolution features of the invention substantially reduce line shortening and corner rounding and also serve as assist features. Further, the sub-resolution features also improve the repeatability of the printing process and allow for greater critical dimension control.

Moreover, when the sub-resolution line features replace the corners of the printable feature, corner rounding of the mask itself is also reduced. As a result, mask-to-mask repeatability in the manufacture of the masks is also greatly improved.

Additionally, when writing the pattern on the mask, data representing the sub-resolution assist feature may be readily included with the mask pattern data without significantly increasing the total needed data. Further, the line features are represented by adding lines and spaces, rather than by including representations of new types of features, such as when serifs are included. Further, the mask may be inspected for errors much more easily than is possible when serifs are included.

Though the above embodiments of the invention use a deep trench pattern as an example, the invention is also applicable to other repetitive structures. As an example, the invention is also applicable to mask patterns for contact windows as well as to mask patterns for lines and spaces features.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a photolithographic mask for use in an optical projection system; said method comprising:
    providing a mask pattern for printing a dense array of substantially identical features on a substrate, each printable feature of said array having at least one corner; and
    incorporating, in each feature of said array of features of said mask pattern, only one line feature proximate to each selected area of said mask pattern that results in the printing of said at least one corner of each feature of said array, each one of said one line feature proximate one of selected areas and having a line width that is smaller than a minimum resolution of said optical projection system, and wherein said only one line feature extends between adjoining ones of said array of printable features.

2. The method of claim 1 wherein an end of each one of said only one line feature is disposed at one of each of said selected areas of said mask pattern for each feature of said array of printable features.

3. The method of claim 1 wherein said only one line feature and said printable features of said array comprise openings formed in at least one of an opaque region, a partially transmissive region, and a phase shifting region of said mask.

4. The method of claim 1 wherein at least one of said array of printable features has a rectangular shape, and wherein said incorporating step includes incorporating one line feature proximate, each one of said selected areas that results in a corner of said rectangular printable features of said array.

5. The method of claim 1, wherein at least one of said array of at printable features has a rectangular shape, and wherein the length of each one of said at least one line feature is perpendicular to a long side of said rectangular-shaped printable features.

6. A photolithographic mask for use in an optical projection system;
    said photolithogruphic mask comprising:
    a mask pattern for printing a dense array of substantially identical features on a substrate each printable feature of said array having at least one corner; and
    one only line feature formed proximate each one of said selected areas of said mask, pattern that results in the printing of said at least one corner of each feature of said array, each one of said only one line features having a line width that is smaller than a minimum resolution of said optical projection system, and wherein said at least one line feature extends between adjoining selected areas of said array of printable features.

7. The photolithographic mask of claim 6 wherein an end of each one of said one line feature is disposed at selected areas of said mask pattern at each one of said array of printable features.

8. The photolitbographic mask of claim 6 wherein an end of said only one line feature contacts at least two of said array of printable features.

9. The photolithographic mask of claim 6 wherein said only one line feature formed proximate each selected area that results in a corner and each one of said array of printable features comprise openings formed in at least one of an opaque region, a partially transmissive region, and a phase shifting region of said mask.

10. The photolithographic mask of claim 6 wherein a plurality of said array of printable features have a rectangular shape, and wherein said mask includes a plurality of only one line features each of said one line features proximate selected areas of said mask pattern corresponding to a corner of each one of said rectangular printable feature.

11. A method of fanning a photolithographic mask for use in an optical projection system; said method comprising:
  providing a mask pattern for printing a dense array of substantially identical rectangular features; and
  incorporating, in each rectangular feature of said mask pattern, a plurality of line features on a substrate, each proximate to a selected area that results in the printing of a respective corner of at least one of said array of rectangular features, each of said plurality of line features having a line width that is smaller than a minimum resolution of said optical projection wherein said line features are perpendicular to a length of at least one of said array of rectangular features, and wherein said line features extend between adjoining areas of said array of rectangular features.

12. A photolithographic mask for use in an optical projection system;
  said photolithographic mask comprising:
  a mask pattern for printing dense array of substantial identical rectangular features; and
  at least one line featured formed in each area of said mask pattern for printing a rectangular feature of said array, each line feature proximate to a selected area of said mask pattern that results in a respective corner of at least one of said array of rectangular features, each of said at least one line features having a line width that is smaller than a minimum resolution of said optical projection system, where each of said at least one features is perpendicular to a length of at least one of said array of rectangular features, features comprise part of a dense array pattern formed in said mack, and wherein said line features extend between adjoining areas of said array of said rectangular features.

* * * * *

UNITED STATES PATENT AND TRADEMARK OFFICE
CERTIFICATE OF CORRECTION

PATENT NO. : 7,141,338 B2 Page 1 of 1
APPLICATION NO. : 10/292169
DATED : November 28, 2006
INVENTOR(S) : Chen et al.

It is certified that error appears in the above-identified patent and that said Letters Patent is hereby corrected as shown below:

Column 7, line 16; delete "fanning" insert --forming--

Signed and Sealed this

First Day of May, 2007

JON W. DUDAS
*Director of the United States Patent and Trademark Office*